United States Patent
Hitokawa et al.

(10) Patent No.: US 11,221,558 B2
(45) Date of Patent: Jan. 11, 2022

(54) BOTTOM ANTIREFLECTIVE COATING FORMING COMPOSITION

(71) Applicant: AZ Electronic Materials (Luxembourg) S.a.r.l., Luxembourg (LU)

(72) Inventors: Hiroshi Hitokawa, Kakegawa (JP); Tetsumasa Takaichi, Kakegawa (JP); Shunji Kawato, Kakegawa (JP); Tomohide Katayama, Kakegawa (JP)

(73) Assignee: Merck Patent GmbH, Darmstadt (DE)

( * ) Notice: Subject to any disclaimer, the term of this patent is extended or adjusted under 35 U.S.C. 154(b) by 433 days.

(21) Appl. No.: 16/324,299

(22) PCT Filed: Aug. 2, 2017

(86) PCT No.: PCT/EP2017/069501
§ 371 (c)(1),
(2) Date: Feb. 8, 2019

(87) PCT Pub. No.: WO2018/029053
PCT Pub. Date: Feb. 15, 2018

(65) Prior Publication Data
US 2019/0171107 A1    Jun. 6, 2019

(30) Foreign Application Priority Data

Aug. 9, 2016 (JP) .............................. JP2016-156900

(51) Int. Cl.
| | |
|---|---|
| G03F 7/09 | (2006.01) |
| C09D 125/18 | (2006.01) |
| C09D 133/14 | (2006.01) |
| G03F 7/16 | (2006.01) |
| G03F 7/20 | (2006.01) |
| G03F 7/30 | (2006.01) |

(52) U.S. Cl.
CPC ........... *G03F 7/091* (2013.01); *C09D 125/18* (2013.01); *C09D 133/14* (2013.01); *G03F 7/16* (2013.01); *G03F 7/20* (2013.01); *G03F 7/30* (2013.01)

(58) Field of Classification Search
CPC ....... G03F 7/091; G03F 7/094; C09D 125/08; C09D 125/18
See application file for complete search history.

(56) References Cited

U.S. PATENT DOCUMENTS

| | | | |
|---|---|---|---|
| 2003/0146416 A1 | 8/2003 | Takei et al. | |
| 2007/0015083 A1 | 1/2007 | Babich et al. | |
| 2008/0096125 A1 | 4/2008 | Kim et al. | |
| 2010/0151381 A1* | 6/2010 | Tachibana | C09D 133/16 430/270.1 |
| 2012/0251956 A1* | 10/2012 | Rahman | H01L 21/0276 430/311 |
| 2012/0308939 A1 | 12/2012 | Kudo et al. | |

FOREIGN PATENT DOCUMENTS

| | | | |
|---|---|---|---|
| JP | 4654544 B2 | 3/2011 | |
| JP | 5418906 B2 | 2/2014 | |
| WO | WO-03058345 A2 | 7/2003 | |
| WO | WO-2018029053 A1 * | 2/2018 | ........... C09D 133/14 |

OTHER PUBLICATIONS

International Search Report for PCT/EP2017/069501 dated Sep. 6, 2017.
Written Opinion of the International Searching Authority for PCT/EP2017/069501 dated Sep. 6, 2017.

* cited by examiner

*Primary Examiner* — John A McPherson
*Assistant Examiner* — Nicholas E Brown
(74) *Attorney, Agent, or Firm* — Faegre Drinker Biddle & Reath LLP

(57) ABSTRACT

[Problem to be Solved] To provide a bottom antireflective coating forming composition which can show high etching resistance and can be crosslinked even at a relatively low temperature. Further, to provide a resist pattern manufacturing method and a device manufacturing method using the same. [Solution] The bottom antireflective coating forming composition comprises: a polymer A comprising specific repeating units; a low molecular crosslinking agent having a molecular weight of 100 to 3,000; and a solvent. The resist pattern manufacturing method and the device manufacturing method using the same are also provided.

17 Claims, No Drawings

BOTTOM ANTIREFLECTIVE COATING FORMING COMPOSITION

CROSS-REFERENCE TO RELATED APPLICATIONS

This application is a national stage application (under 35 U.S.C. § 371) of PCT/EP2017/069501, filed Aug. 2, 2017, which claims benefit of Japanese Application No. 2016-156900, filed Aug. 9, 2016.

TECHNICAL FIELD

The present invention relates to a bottom antireflective coating forming composition used when a pattern is formed by a lithography technique using a photoresist, a bottom antireflective coating using the same, and a resist pattern manufacturing method. Further, the present invention also relates to a method for manufacturing a device such as a semiconductor using the resist pattern and the lithography technique.

BACKGROUND ART

In the production process of a device such as a semiconductor, fine processing by a lithography technology using a photoresist has generally been performed. The steps of the fine processing include: forming a thin photoresist layer on a semiconductor substrate such as a silicon wafer; covering the layer with a mask pattern corresponding to the pattern of a target device; exposing the layer with active light such as ultraviolet rays through the mask pattern; developing the exposed layer to thereby obtain a photoresist pattern; and etching the substrate using the resulting photoresist pattern as a protective coating. Thereby, a fine unevenness corresponding to the above-described pattern is formed. In these photolithography steps, there is a problem that the dimensional accuracy of the photoresist pattern is reduced by the influence of standing waves due to the reflection of light from the substrate and by the influence of irregular reflections of the exposure light due to the steps of the substrate. Therefore, in order to solve the problem, a method of providing a bottom antireflective coating has been widely studied. Examples of the characteristics required for such a bottom antireflective coating include having large absorbance to the radiation used for the exposure of a photoresist, preventing irregular reflections and the like so that the cross section of the photoresist after exposure and development will be vertical to the substrate surface, and being insoluble in a solvent contained in a photoresist composition (intermixing hardly occurring).

Patent Literature 1 discloses an antireflective coating composition containing a specific high molecular crosslinking agent. Patent Literature 2 discloses a composition for forming a gap-filling material containing a specific polymer, but there is no description of whether or not a bottom antireflective coating can be formed, and the composition can satisfy required characteristics as an antireflective coating.

CITATION LIST

[Patent Literature 1]
 Japanese Patent No. 5418906 B2
[Patent Literature 2]
 Japanese Patent No. 4654544 B2

SUMMARY OF INVENTION

Technical Problem

The present inventors have considered that in addition to the above-described characteristic, etching resistance, applicability, and gap filling property in a complicated and fine substrate (for example, a stepped substrate) are useful for an antireflective coating in a lithography step, made intensive studies, and found a composition to be described below.

Further, the present inventors have found that the resulting composition is advantageous in the manufacturing process. For example, other components are not adversely affected since, even when baking temperature is reduced to a relatively low temperature, sufficient crosslinking reaction proceeds, and a coating can be formed.

Solution to Problem

The bottom antireflective coating forming composition according to the present invention comprises:
 a polymer A comprising a repeating unit represented by formula (I) and a repeating unit represented by formula (II):

[Formula 1]

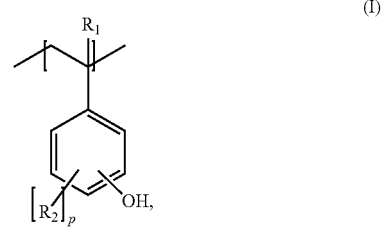

wherein
 $R_1$ is hydrogen, $C_{1-6}$ alkyl, halogen, or cyano,
 $R_2$ is $C_{1-6}$ alkyl, hydroxy, halogen, or cyano,
 p is 0, 1, 2, 3, or 4,
 $R_3$ is hydrogen, $C_{1-6}$ alkyl, halogen, or cyano,
 $R_4$ is $C_{1-6}$ alkyl, halogen, or cyano, and
 q is 0, 1, 2, 3, 4, or 5;
 a low molecular crosslinking agent having a molecular weight of 100 to 3,000; and
 a solvent.

Further, the resist pattern manufacturing method according to the present invention comprises:
 forming, on a substrate, a bottom antireflective coating from a bottom antireflective coating forming composition of the present invention;
 forming a photoresist coating on the bottom antireflective coating; and
 exposing and developing the photoresist coating to form a resist pattern.

Further, the device manufacturing method according to the present invention comprises:

forming, on a substrate, a bottom antireflective coating from a bottom antireflective coating forming composition of the present invention;

forming a photoresist coating on the bottom antireflective coating;

exposing and developing the photoresist coating to form a resist pattern; and forming a gap in the substrate or the layer on the substrate using the resist pattern as a mask.

Effects of the Invention

It has been verified that a bottom antireflective coating formed from the composition of the present invention shows high etching resistance. Further, it has been verified that the bottom antireflective coating has suitably satisfied the index of refraction (n) and the absorption parameter (k) required for the bottom antireflective coating and thus has reduced standing waves. Further, it has been verified that the present composition is excellent in applicability and gap filling property. Furthermore, it has been verified that, in the bottom antireflective coating formed from the composition of the present invention, a sufficient crosslinking reaction proceeds even when the coating is heated at a relatively low temperature.

DESCRIPTION OF EMBODIMENTS

The above outlines and the following details are for describing the present invention, and are not for limiting the claimed invention.

In the present specification, when the numerical range is shown using "to" or "-", the numerical range includes both numbers before and after the "to" or "-", and the unit is common for the both numbers, unless otherwise specified. For example, 5 to 25 mol % means 5 mol % or more and 25 mol % or less.

In the present specification, the descriptions such as "$C_{x-y}$", "$C_x$-$C_y$", and "$C_x$" mean the number of carbons in a molecule or a substituent. For example, $C_{1-6}$ alkyl means an alkyl chain having 1 to 6 carbons (such as methyl, ethyl, propyl, butyl, pentyl, and hexyl).

In the present specification, when a polymer comprises plural types of repeating units, these repeating units are copolymerized. Unless otherwise specified, the copolymerization may be any of alternating copolymerization, random copolymerization, block copolymerization, graft copolymerization, or a mixture thereof.

In the present specification, Celsius is used as the unit of temperature, unless otherwise specified. For example, 20 degrees means 20 degrees Celsius (20° C.).

Bottom Antireflective Coating Forming Composition

The bottom antireflective coating forming composition in the present invention is advantageously used in the manufacture of a pattern using a lithography technique. This composition comprises the following polymer A, a low molecular crosslinking agent having a molecular weight of 100 to 3,000, and a solvent.

Polymer A

Polymer A comprises a repeating unit represented by formula (I) and a repeating unit represented by formula (II).

[Formula 2]

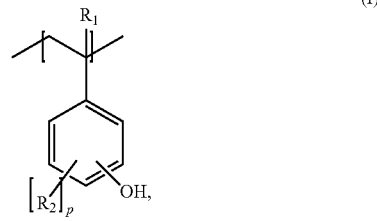

(I)

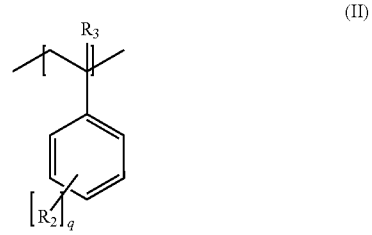

(II)

$R_1$ is hydrogen, $C_{1-6}$ alkyl, halogen, or cyano. $R_1$ is preferably hydrogen, methyl, ethyl, propyl, isopropyl, t-butyl, fluorine, chlorine, or cyano; $R_1$ is more preferably hydrogen, methyl, fluorine, or chlorine; and $R_1$ is particularly preferably hydrogen.

$R_2$ is $C_{1-6}$ alkyl, hydroxy, halogen, or cyano. $R_2$ is preferably methyl, ethyl, propyl, isopropyl, t-butyl, hydroxy, fluorine, chlorine, or cyano; and $R_2$ is more preferably methyl, hydroxy, fluorine, or chlorine.

p is 0, 1, 2, 3, or 4; p is preferably 0 or 1; and p is particularly preferably 0.

$R_3$ is hydrogen, $C_{1-6}$ alkyl, halogen, or cyano. $R_3$ is preferably hydrogen, methyl, ethyl, propyl, isopropyl, t-butyl, fluorine, chlorine, or cyano; $R_3$ is more preferably hydrogen, methyl, fluorine, or chlorine; and $R_3$ is particularly preferably hydrogen.

$R_4$ is $C_{1-6}$ alkyl, halogen, or cyano. $R_4$ is preferably methyl, ethyl, propyl, isopropyl, t-butyl, fluorine, chlorine, or cyano; and $R_4$ is more preferably methyl, fluorine, or chlorine.

q is 0, 1, 2, 3, 4, or 5; q is preferably 0 or 1; and q is particularly preferably 0.

In polymer A, $R_1$, $R_2$, $R_3$, and $R_4$ may be each independently the same or different, but it is preferable that $R_1$, $R_2$, $R_3$, and $R_4$ is each independently the same from the point of view of reducing production cost. Polymer A may comprise or may not comprise a repeating unit other than the repeating unit represented by formula (I) and the repeating unit represented by formula (II). But polymer A preferably comprises only the repeating unit represented by formula (I) and the repeating unit represented by formula (II).

Preferably, in all the repeating units in polymer A, the ratio of the repeating unit represented by formula (I) is 70 to 95 mol %, and the ratio of the repeating unit represented by formula (II) is 5 to 30 mol %. More preferably, in all the repeating units in polymer A, the ratio of the repeating unit represented by formula (I) is 80 to 90 mol %, and the ratio of the repeating unit represented by formula (II) is 10 to 20 mol %. From the point of view of improving crosslinking properties, it is preferred to use a polymer A comprising a larger number of repeating units represented by formula (I) as described above.

In the present application, the weight average molecular weight can be measured by gel permeation chromatography (GPC). In a suitable example of this measurement, a GPC column is set to 40 degrees Celsius; 0.6 mL/min of tetrahydrofuran is used as an elution solvent; and monodisperse polystyrene is used as a standard.

The weight average molecular weight (Mw) of polymer A is preferably 2,000 to 5,000, more preferably 3,000 to 4,500. A polymer A having a weight average molecular weight exceeding the above range is not preferred from the point of view of gap filling property in the preparation of a composition.

Low Molecular Crosslinking Agent Having Molecular Weight of 100 to 3,000

The low molecular crosslinking agent contained in the bottom antireflective coating forming composition of the present invention preferably has a molecular weight of 100 to 3,000 and more preferably has a molecular weight of 300 to 700. A high molecular crosslinking agent having a molecular weight exceeding the above range is not preferred since crosslinking temperature during coating formation is high, which adversely affects other layers and coatings. In the present composition, the content of the low molecular crosslinking agent having a molecular weight of 100 to 3,000 is preferably 5 to 50% by mass, more preferably 15 to 40% by mass, and further preferably 10 to 40% by mass, relative to the mass of polymer A in the composition. The present composition does not comprise a high molecular crosslinking agent (for example, a crosslinking agent having a molecular weight of 3,001 or more).

The crosslinking temperature for forming a bottom antireflective coating from the present composition is preferably 50 to 230 degrees, more preferably 80 to 220 degrees, and particularly preferably 80 to 190 degrees.

The low molecular crosslinking agent of the present invention can act as an electrophilic material, and can form a carbocation either independently or in the presence of an acid. Therefore, a compound having a group such as alcohol, ether, ester, olefin, methoxymethylamino, methoxymethylphenyl, and other molecules containing a plurality of electrophilic sites, can be crosslinked with a polymer. Examples of the compound which can be used as a crosslinking agent are 1,3-adamantanediol, 1,3,5-adamantanetriol, a polyfunctional reactive benzyl compound, methylol, an aminoplast crosslinking agent, glycolurils, Cymel, and Powderlink.

The low molecular crosslinking agent of the present invention is preferably represented by formula (VI).

[Formula 3]

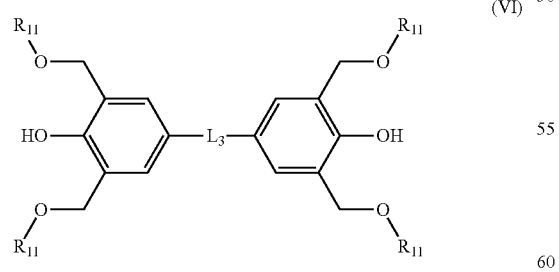

(VI)

In formula (VI), $L_3$ is a direct bond or substituted or unsubstituted $C_{1-3}$ alkyl. $L_3$ is preferably a direct bond or methyl, more preferably a direct bond. The substituent is preferably hydrogen, methyl, $C_{6-10}$ aryl, formula (VII), or formula (VIII), more preferably methyl or formula (VII). In formula (VI), $R_{11}$ is hydrogen or methyl.

[Formula 4]

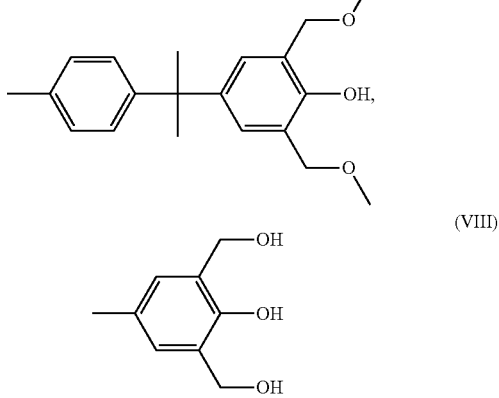

(VII)

(VIII)

The illustrated compounds of the low molecular crosslinking agent of the present invention are as follows, but the scope of the present invention is not limited thereto.

[Formula 5]

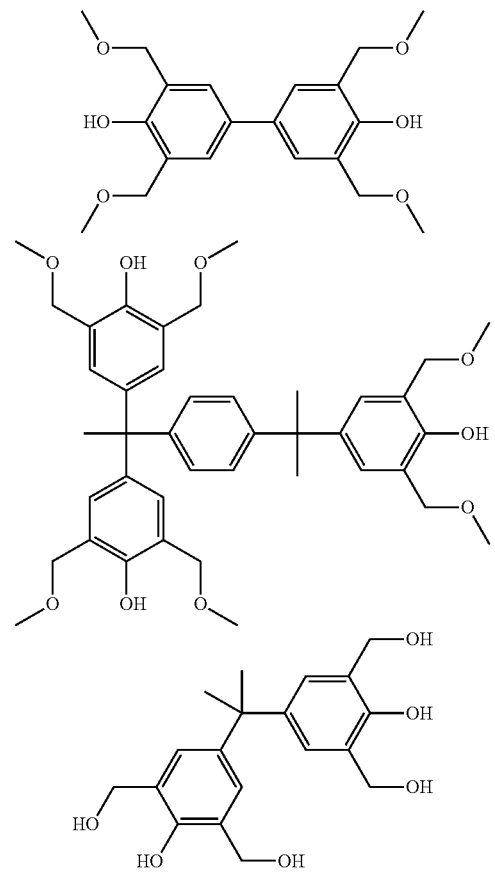

Acid Generator

The bottom antireflective coating forming composition of the present invention may further comprise an acid generator. The content of the acid generator in the present composition is preferably 0.1 to 10% by mass, more preferably 1 to 7% by mass, relative to the mass of polymer A.

The acid generator may be a thermal acid generator which can generate strong acid by heating. The thermal acid generator (TAG) used in the present invention may be one or a plurality of thermal acid generators, which generate, by heating, an acid which can react with a polymer present in the present invention and can propagate the crosslinking of the polymer, and the thermal acid generator is particularly preferably a strong acid such as sulfonic acid. The thermal acid generator is preferably activated at a temperature of higher than 80° C. Examples of the thermal acid generator include metal-free sulfonium and iodonium salts, such as triarylsulfonium, dialkylarylsulfonium, and diarylalkylsulfonium salts of a strong non-nucleophilic acid, and alkylaryliodonium and diaryliodonium salts of a strong non-nucleophilic acid; and ammonium, alkylammonium, dialkylammonium, trialkylammonium, and tetraalkylammonium salts of a strong non-nucleophilic acid. Further, a covalent thermal acid generator is also considered as a useful additive, and examples include a 2-nitrobenzyl ester of an alkyl- or arylsulfonic acid and other esters of sulfonic acid which thermally decompose to give free sulfonic acid. Examples thereof include diaryliodonium perfluoroalkylsulfonate, diaryliodonium tris(fluoroalkylsulfonyl)methide, diaryliodonium bis(fluoroalkylsulfonyl)methide, diaryliodonium bis(fluoroalkylsulfonyl)imide, and diaryliodonium quaternary ammonium perfluoroalkylsulfonate. Examples of labile esters include 2-nitrobenzyl tosylate, 2,4-dinitrobenzyl tosylate, 2,6-dinitrobenzyl tosylate, and 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitrobenzenesulfonate; phenolic sulfonate esters such as phenyl and 4-methoxybenzenesulfonate; quaternary ammonium tris(fluoroalkylsulfonyl)methide, quaternary alkylammonium bis(fluoroalkylsulfonyl)imide, and an alkyl ammonium salt of an organic acid such as a triethylammonium salt of 10-camphorsulfonic acid. A variety of aromatic (anthracene, naphthalene, or benzene derivative) sulfonic acid amine salts can be employed as the TAG, including those disclosed in U.S. Pat. No. 3,474,054 (Patent Literature 3), U.S. Pat. No. 4,200,729 (Patent Literature 4), U.S. Pat. No. 4,251,665 (Patent Literature 5), and U.S. Pat. No. 5,187,019 (Patent Literature 6).

Solvent

The solvent used in the bottom antireflective coating forming composition of the present invention preferably can dissolve each component and each solid in the composition. Specific examples of the solvent which can be used include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether (PGME), propylene glycol monomethyl ether acetate (PGMEA), propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methybutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, and N-methylpyrrolidone. These solvents may be used singly or in combinations of two or more. The solvent of the present composition is preferably propylene glycol monomethyl ether, propylene glycol monomethyl ether acetate, or a mixture thereof. The solvent preferably contains no water in consideration of other layers and coatings. For example, the content of water in the whole solvent is particularly preferably 0.0% by weight. The content of water in the whole solvent is preferably 0.01% by weight or less, more preferably 0.001% by weight or less.

The content of the solvent in the whole composition is preferably a content that can dissolve all the components and all the solids in the composition. For example, the content of the solvent is preferably 500 to 5,000% by mass, more preferably 1,000 to 4,000% by mass, relative to the mass of polymer A in the composition. The coating thickness after coating formation can be controlled by increasing or decreasing the content of the solvent in the whole composition.

Polymer B

The bottom antireflective coating forming composition of the present invention may further comprise, in addition to polymer A, a polymer B comprising a repeating unit having an aromatic hydrocarbon ring in the main chain or the side chain. Polymer B in the present composition is not polymer A.

The weight average molecular weight (Mw) of polymer B is preferably 800 to 12,000, more preferably 1,000 to 5,000. The content of polymer B in the inventive composition is preferably 0 to 200% by mass, more preferably 1 to 175% by mass, and further preferably 10 to 150% by mass, relative to the mass of polymer A.

According to one aspect of polymer B, polymer B comprises formula (III) as a repeating unit.

[Formula 6]

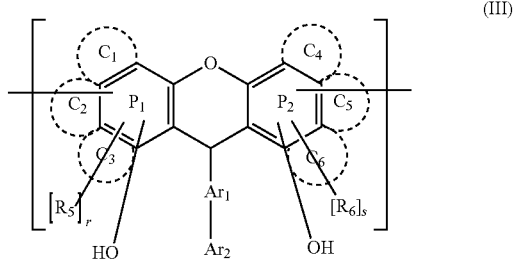

(III)

$Ar_1$ is a direct bond, $C_{1-6}$ alkyl, or $C_{6-14}$ aryl. $Ar_1$ is preferably a direct bond, methyl, ethyl, propyl, isopropyl, t-butyl, phenyl, naphthyl, or phenanthryl; $Ar_1$ is more preferably a direct bond, methyl, ethyl, or phenyl; and $Ar_1$ is further preferably phenyl.

$Ar_2$ is $C_{6-14}$ aryl. $Ar_2$ is preferably phenyl, naphthyl, phenanthryl, or biphenyl; $Ar_2$ is more preferably phenyl or p-biphenyl; and $Ar_2$ is further preferably phenyl.

$R_5$ and $R_6$ are each independently $C_{1-6}$ alkyl, hydroxy, halogen, or cyano. $R_5$ and $R_6$ are each independently preferably methyl, ethyl, propyl, isopropyl, t-butyl, hydroxy, fluorine, chlorine, or cyano; and $R_5$ and $R_6$ are each independently more preferably methyl, hydroxy, fluorine, or chlorine.

r and s are each independently 0, 1, 2, 3, 4, or 5. r and s are each independently preferably 0 or 1; and r and s are each independently more preferably 0.

At least one of the $C_1$, $C_2$, and $C_3$ rings each surrounded by the broken line is an aromatic hydrocarbon ring fused with the adjacent aromatic hydrocarbon ring $P_1$, and the number of carbons in the aromatic hydrocarbon ring is preferably $C_{10-14}$, more preferably $C_{10}$, including the carbons in the aromatic hydrocarbon ring $P_1$.

At least one of the $C_4$, $C_5$, and $C_6$ rings each surrounded by the broken line is an aromatic hydrocarbon ring fused with the adjacent aromatic hydrocarbon ring $P_2$, and the number of carbons in the aromatic hydrocarbon ring is preferably $C_{10-14}$, more preferably $C_{10}$, including the carbons in the aromatic hydrocarbon ring $P_2$.

In formula (III), the bonding positions of $R_5$, $R_6$, and OH are not limited.

For example, in the following structure, the aromatic hydrocarbon ring $P_1$ and the aromatic hydrocarbon ring $C_3$ are fused to form a naphthyl ring, and OH is bonded to the aromatic hydrocarbon ring $C_3$. The repeating unit is bonded through the aromatic hydrocarbon ring $C_3$.

[Formula 7]

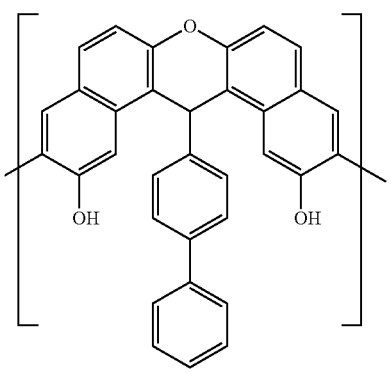

Specific examples of the repeating unit represented by formula (III) include the following formulas, wherein the definitions of $R_5$, $R_6$, r, and s are the same as described above.

[Formula 8]

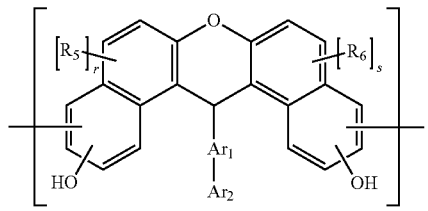
(III)-1

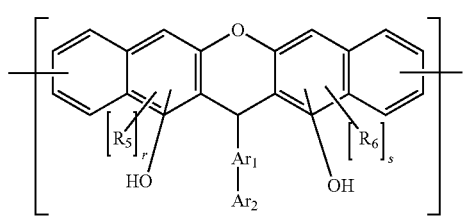
(III)-2

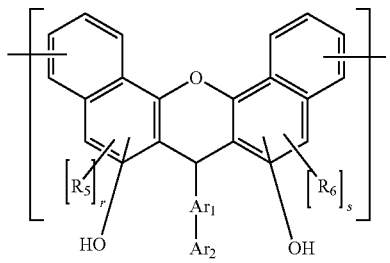
(III)-3

These polymer B may further comprise repeating units (IX) and/or (X).

[Formula 9]

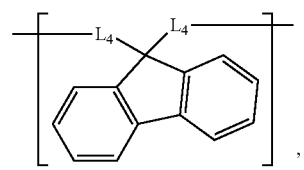
(IX)

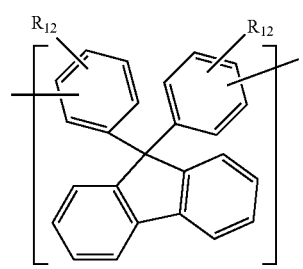
(X)

$L_4$ is each independently a direct bond, methyl, ethyl, vinyl, or acetylene, and $L_4$ is each independently preferably a direct bond or methyl. $R_{12}$ is each independently hydrogen, methyl, ethyl, butyl, propyl, isopropyl, t-butyl, phenyl, or hydroxy; $R_{12}$ is each independently preferably hydrogen, methyl, or hydroxy; and $R_{12}$ is each independently more preferably hydroxy. Specific examples of formula (X) include formula (X)'.

[Formula 10]

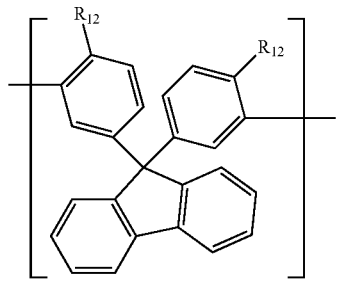
(X)'

When polymer B comprises repeating units (III), (IX), and (X), the ratios of the repeating units represented by formulas (III), (IX), and (X) in all the repeating units of polymer B are each independently preferably 30 to 40 mol %. This is also applied to the case where repeating unit (III)

is repeating unit (III)-1, -2, or -3. This is also applied to the case where the repeating unit (X) is repeating unit (X)'.

According to one aspect of polymer B, polymer B comprises formula (IV) as a repeating unit.

[Formula 11]

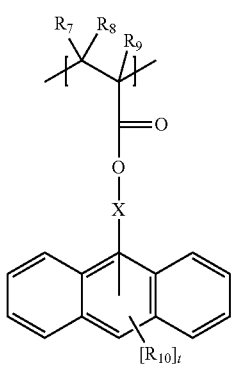

(IV)

Here, X is a direct bond or $C_{1-6}$ alkyl. X is preferably a direct bond, methyl, ethyl, propyl, isopropyl, or t-butyl, more preferably a direct bond or methyl, and further preferably methyl.

$R_7$, $R_8$, and $R_9$ are each independently hydrogen, $C_{1-6}$ alkyl, halogen, or cyano. $R_7$, $R_8$, and $R_9$ are each independently preferably hydrogen, methyl, ethyl, propyl, isopropyl, t-butyl, fluorine, chlorine, or cyano; $R_7$, $R_8$, and $R_9$ are each independently more preferably hydrogen, methyl, fluorine, or chlorine; and $R_7$, $R_8$, and $R_9$ are each independently further preferably hydrogen or methyl. A repeating unit, in which $R_7$ and $R_8$ are hydrogen and $R_9$ is methyl, are more preferred.

$R_{10}$ is $C_{1-6}$ alkyl, hydroxy, halogen, or cyano. $R_{10}$ is preferably methyl, ethyl, propyl, isopropyl, t-butyl, fluorine, chlorine, or cyano; $R_{10}$ is more preferably methyl, fluorine, or chlorine; and $R_{10}$ is further preferably hydrogen or methyl.

t is 0, 1, 2, 3, 4, or 5. t is preferably 0 or 1; and t is more preferably 0.

In formula (IV), the bonding positions of X and $R_{10}$ to the anthracene ring are not limited.

Polymer B may further comprise repeating units (XI), (XII), (XIII), (XIV), and/or (XV).

[Formula 12]

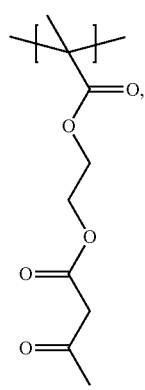

(XI)

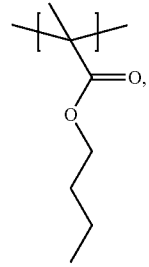

(XII)

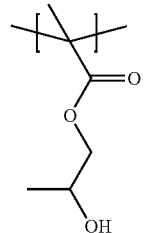

(XIII)

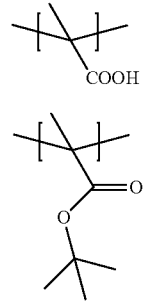

(XIV)

(XV)

According to one aspect of polymer B, polymer B is preferably composed only of the repeating units represented by formulas (IV), (XI), (XIII), and (XV), in which the ratio of each repeating unit in polymer B is 30 to 50 mol %, 30 to 50 mol %, 5 to 20 mol %, and 10 to 30 mol %, respectively. According to one aspect of another polymer B, polymer B is preferably composed only of the repeating units represented by formulas (IV), (XI), (XII), (XIII), and (XIV), in which the ratio of each repeating unit in polymer B is 20 to 60 mol %, 1 to 10 mol %, 1 to 10 mol %, 50 to 80 mol %, and 1 to 10 mol %, respectively.

According to one aspect of polymer B, polymer B comprises formula (V) as a repeating unit.

[Formula 13]

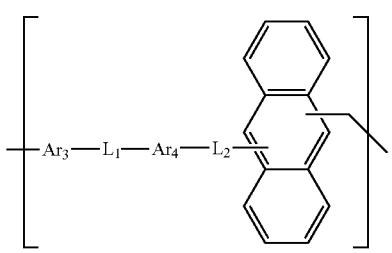

(V)

Here, $Ar_3$ is unsubstituted or substituted $C_{6-14}$ aryl, and the substituent is $C_{1-6}$ alkyl, a hydroxyl group, or a carboxyl group. The $C_{6-14}$ aryl is preferably phenyl, naphthyl, biphenyl, or phenanthryl; the $C_{6-14}$ aryl is more preferably phenyl or biphenyl; and the $C_{6-14}$ aryl is further preferably biphenyl. The substituent is preferably methyl, ethyl, propyl, isopropyl, t-butyl, hydroxyl, or carboxyl, more preferably methyl or hydroxyl. An aspect in which $Ar_3$ is substituted by a substituent, hydroxy is more preferred.

$Ar_4$ is unsubstituted or substituted $C_{6-14}$ aryl, and the substituent is $C_{1-6}$ alkyl, a hydroxyl group, or a carboxyl group. The $C_{6-14}$ aryl is preferably phenyl, naphthyl, biphenyl, or phenanthryl; the $C_{6-14}$ aryl is more preferably phenyl or biphenyl; and the $C_{6-14}$ aryl is further preferably phenyl. The substituent is preferably methyl, ethyl, propyl, isopropyl, t-butyl, hydroxyl, or carboxyl, more preferably methyl or hydroxyl. An aspect in which $Ar_4$ is unsubstituted is more preferred.

$L_1$ and $L_2$ are each independently a direct bond or $C_{1-6}$ alkyl. $L_1$ and $L_2$ are each independently preferably a direct bond, methyl, or ethyl; and $L_1$ and $L_2$ are more preferably ethyl. An aspect in which polymer B comprising formula (V) has the main chain, terminals of which are substituted by hydroxy is preferred.

In formula (V), the bonding position of the repeating units through an anthracene ring and the bonding position of $L_2$ to an anthracene ring are not limited.

Polymer A and polymer B may be dissolved before the bottom antireflective coating forming composition is prepared. In this case, the solvents listed above can be used.

Other Components

The present bottom antireflective coating forming composition may comprise a surfactant in addition to the components described above. The surfactant is useful for improving applicability and solubility. The content of the surfactant in the present composition is preferably 0.01 to 5% by mass, more preferably 0.05 to 3% by mass, relative to polymer A in the present composition.

To the bottom antireflective coating forming composition of the present invention, may be added other components such as a smoothing agent, monomeric dye, lower alcohol (C1-C6 alcohol), a surface leveling agent, an adhesive promoter, a defoaming agent, and a preservative. The content of these components in the present composition is preferably 0.1 to 10% by mass, more preferably 0.5 to 5% by mass, relative to polymer A in the present composition.

The absorption parameter (k) of the bottom antireflective coating formed from the composition of the present invention is in the range of 0.01 to 1.0 at an exposure wavelength, as can be obtained from ellipsometric measurement. In one embodiment, the composition has a k-value in the range of 0.01 to 0.50 at an exposure wavelength. The index of refraction (n) of the bottom antireflective coating is also optimized, and can be in the range of 1.3 to 2.0, preferably 1.5 to 1.9, at an exposure wavelength. The values of n and k can be calculated using an ellipsometer, such as a J. A. Woollam WVASE VU-32 (trademark) Ellipsometer. The accurate values of the optimum range with respect to k and n depend on the exposure wavelength used for exposing the photoresist coating formed on the bottom antireflective coating, and the application method.

Formation of Bottom Antireflective Coating and Photoresist Coating

One aspect of the bottom antireflective coating forming method according to the present invention will be described.

The bottom antireflective coating forming composition of the present invention is applied onto a substrate (such as a silicon/silicon dioxide-covered substrate, a silicon nitride substrate, a silicon wafer substrate, a glass substrate, and an ITO substrate) by a suitable coating method such as a spinner and a coater. After coating, a bottom antireflective coating is formed by heating. The heating conditions are suitably selected from the following ranges. The heating temperature is generally 80 to 250° C., preferably 100 to 250° C., and the heating time is generally 0.3 to 5 minutes, preferably 0.5 to 2 minutes. The curing reaction proceeds in the applied composition by the heating to form a bottom antireflective coating.

A photoresist composition (such as a positive-type photoresist composition) is applied onto the bottom antireflective coating formed in this way. Here, the positive-type photoresist composition refers to a photoresist composition which causes a reaction by photoirradiation to increase the solubility in a developer. The photoresist composition to be used is not particularly limited, but any one of a positive-type photoresist composition, a negative-type photoresist composition, and a negative tone development (NTD) photoresist composition may be used as long as it has sensitivity to the exposure light for pattern formation.

In the resist pattern manufacturing method of the present invention, the presence of a coating and a layer other than the bottom antireflective coating formed from the present bottom antireflective coating forming composition and the photoresist coating is also permitted.

Next, exposure is performed through a predetermined mask. Although the wavelength of the light used for exposure is not particularly limited, it is preferred to expose with the light having a wavelength of 13.5 to 248 nm. Specifically, a KrF excimer laser (wavelength: 248 nm), an ArF excimer laser (wavelength: 193 nm), extreme ultraviolet rays (wavelength: 13.5 nm), and the like can be used, and the KrF excimer laser is more preferred. These wavelengths permit a range of ±1%. After the exposure, post exposure bake may optionally be performed. The heating conditions are suitably selected from the following ranges. The heating temperature is 80 to 150° C., preferably 100 to 140° C., and the heating time is 0.3 to 5 minutes, preferably 0.5 to 2 minutes.

Next, development is performed with a developer. When a positive-type photoresist composition is used, the positive-type photoresist layer in the exposed part is removed by the development to form a resist pattern. The resist pattern can be further rendered fine using a shrink material or the like.

A 2.38 wt % TMAH aqueous solution is preferred as a developer used for development in the above resist pattern forming method. The bottom antireflective coating can be easily dissolved and removed at room temperature by using such a developer. Further, a surfactant and the like may also be added to the developer.

The conditions of development are suitably selected from the following ranges; the temperature of the developer is generally 5 to 50° C., preferably 25 to 40° C., and the developing time is generally 10 to 300 seconds, preferably 30 to 60 seconds.

A gap can be formed in the substrate or the layer on the substrate using the above resist pattern as a mask. A well-known technique such as etching (dry etching and wet etching) can be used for forming the gap. After forming the gap, the resist pattern can be removed by contacting the resist pattern with water, a liquid mixture of a water-soluble organic solvent and water, or an alkali aqueous solution. Further, wiring can be formed by using the gap formed.

Then, the substrate is optionally further processed to form a device. A well-known method can be applied to the above further processing. After forming the device, the substrate is optionally cut into chips, connected to a leadframe, and packaged with a resin. In the present invention, the packaged substrate is referred to as a device.

EXAMPLES

Hereinafter, the present invention will be described with specific examples. These examples are only for description purpose and not for limiting the scope of the present application.

Preparation Example 1 of Composition 1

As a polymer B, poly(anthracenemethanol methacrylate/acetoacetoxy methacrylate/2-hydroxypropyl methacrylate/t-butyl methacrylate) (P090D polymer) was dissolved in PGMEA so that the content would be 17% by mass.

As a thermal acid generator, 0.055 g of (±)-camphor-10-sulfonic acid (CSA, Wako Pure Chemical Industries, Ltd.) and 0.0025 g of triethyl amine (Kanto Chemical Co., Inc.) were dissolved in 7.3 g of PGMEA.

A surfactant (MEGAFAC R-40, DIC Corporation) was dissolved in PGMEA so that the content thereof would be 5% by mass.

A mixture of 62.1 g of PGMEA and 28.6 g of PGME as a solvent was mixed with 3.2 g of a poly(hydroxystyrene/styrene) copolymer (VPS-2515) as a polymer A, 4.6 g of the above polymer B solution, 0.6 g of a low molecular cross-linking agent (TMOM-BP), 0.8 g of the above thermal acid generator solution, and 0.048 g of the above surfactant solution in this order and thoroughly dissolved. The resulting solution was filtered through a 0.2 μm filter to prepare a composition 1.

[Formula 14]

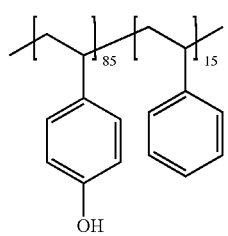

(VSP-2515, Nippon Soda Co., Ltd., molecular weight: 3300 to 4300)

[Formula 15]

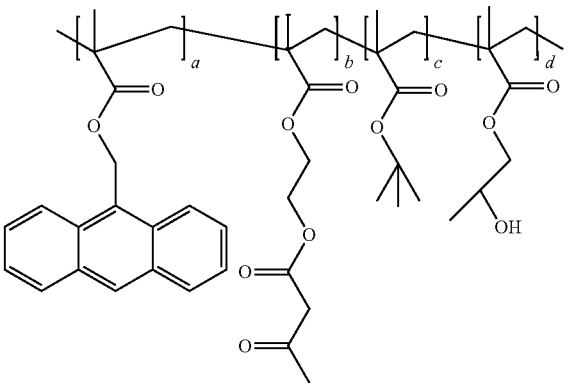

(P090D polymer, TOHO Chemical Industry Co., Ltd., a:b:c:d = 35.7:35.7:17.9:10.7, molecular weight 4000 to 8000)

[Formula 16]

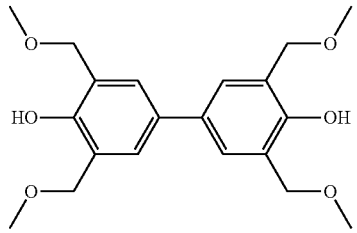

(TMOM-BP, Honshu Chemical Industry Co., Ltd.)

Preparation Examples 2 to 8 of Compositions 2 to 8, and Comparative Preparation Examples 1 to 3 of Comparative Compositions 1 to 3

The compositions 2 to 8 and comparative compositions 1 to 3 were prepared in the same manner as in Preparation Example 1 of Composition 1 except that the composition and the amount were changed as shown in Table 1.

TABLE 1

| | Polymer A | Polymer B | Low molecular crosslinking agent | Thermal acid generator |
|---|---|---|---|---|
| Composition 1 | VPS-2515, 3.2 g | P090D, 0.8 g | TMOM-BP, 0.6 g | 0.08 g |
| Composition 2 | VPS-2515, 4.0 g | — | TMOM-BP, 0.6 g | 0.08 g |
| Composition 3 | VPS-2515, 3.2 g | Polymer-7, 0.8 g | TMOM-BP, 0.6 g | 0.08 g |
| Composition 4 | VPS-2515, 1.6 g | Polymer-7, 2.4 g | TMOM-BP, 0.6 g | 0.08 g |
| Comparative Composition 1 | VP2500, 3.2 g | P070D, 0.8 g | TMOM-BP, 0.6 g | 0.08 g |
| Comparative Composition 2 | SGPL, 4.0 g | — | MX-270, 0.6 g | 0.08 g |
| Comparative Composition 3 | VPS-2515, 3.2 g | P090D, 0.8 g | Mowital B14S, 0.6 g | 0.18 g |
| Composition 5 | VPS-2515, 3.6 g | U-98 polymer, 0.4 g | TMOM-BP, 0.6 g | 0.08 g |
| Composition 6 | VPS-2515, 3.2 g | P090D, 0.8 g | MX-270, 0.6 g | 0.08 g |
| Composition 7 | VPS-2515, 3.2 g | P090D, 0.8 g | HMOM-TPPA, 0.6 g | 0.08 g |
| Composition 8 | VPS-2515, 3.2 g | P090D, 0.8 g | TM-BIP-A, 0.6 g | 0.08 g |

[Formula 17]
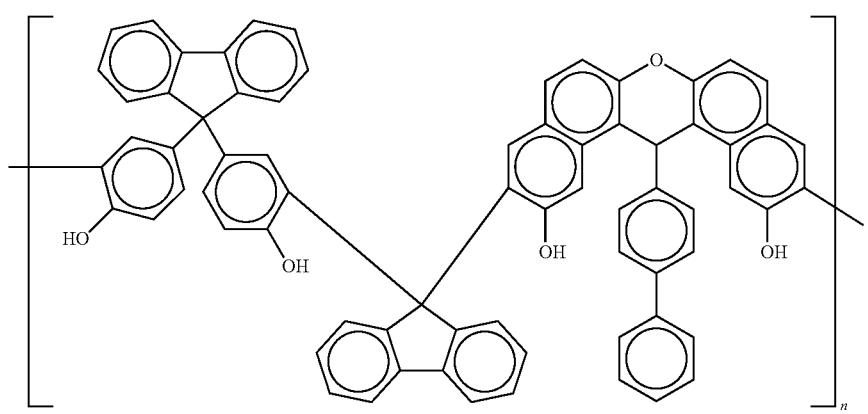
(Polymer-7, Merck Performance Materials Manufacturing G.K., molecular weight: 1000 to 4000)
[Formula 18]
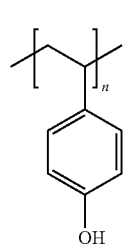
(VP2500, Nippon Soda Co., Ltd., molecular weight: 2500 to 4000)
[Formula 19]
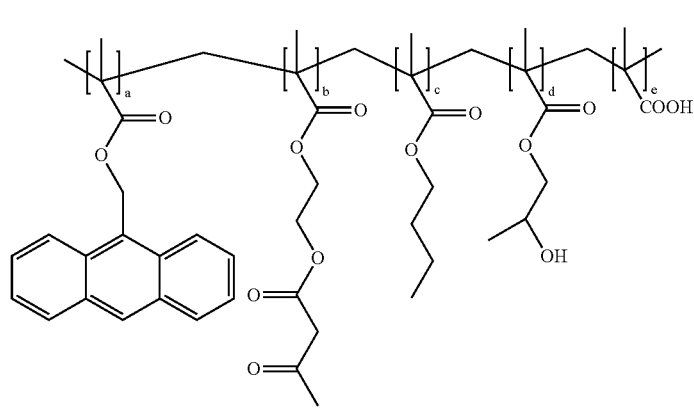
(P070D polymer, a:b:c:d:e = 1:0.1:0.1:2.2:0.1, TOHO Chemical Industry Co., Ltd., molecular weight: 20000 to 30000)
[Formula 20]
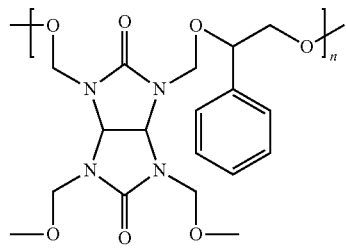
(SGPL polymer, Merck Performance Materials Manufacturing G.K., molecular weight: 6000 to 10000)

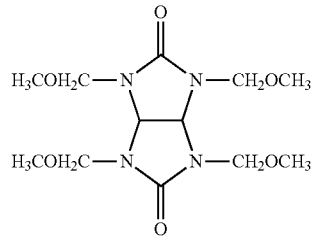
(MX-1270, Sanwa Chemical Co., Ltd.)
[Formula 21]
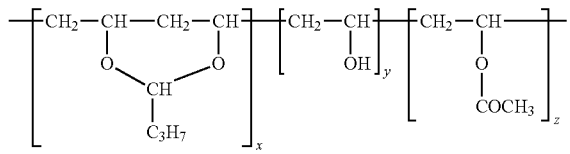
(Mowital B14S, X:Y:Z = 67.5 - 75.2:21.0 - 26.5:3.8 - 6.0, Kuraray Co., Ltd., molecular weight: 10000 to 20000)
[Formula 22]
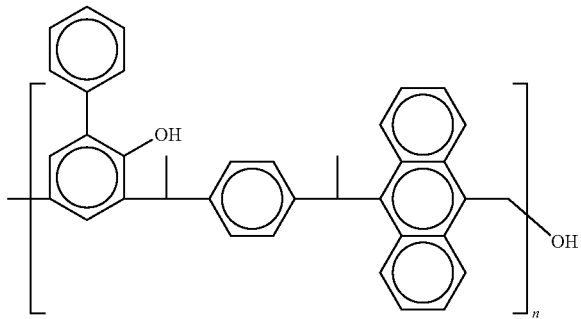
(U-98 polymer, Merck Performance Materials Manufacturing G.K., molecular weight: 1500 to 2500)
[Formula 23]
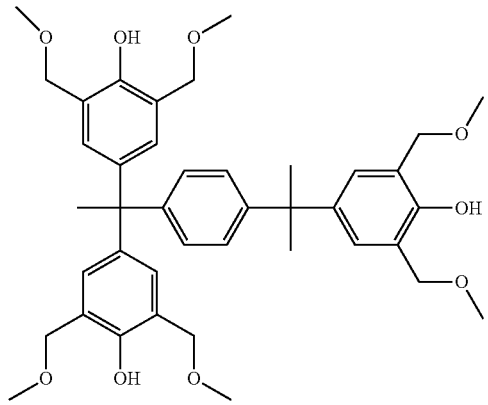
(HMOM-TPPA, Honshu Chemical Industry Co., Ltd.)
[Formula 24]

[Formula 25]

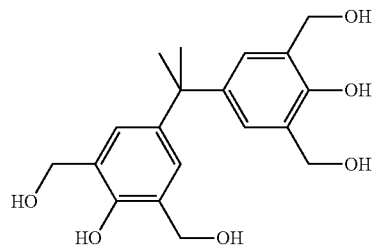

(TM-BIP-A, ASAHI YUKIZAI CORPORATION)

Evaluation of Etching Rate

The compositions and comparative compositions shown in Table 2 were applied onto a bare silicon wafer by spin coating and baked for 60 seconds at 215° C. to form a coating having a thickness of 120 nm. The coating was etched in a plasma atmosphere using dry etcher equipment (NE-5000, ULVAC, Inc.). The etching rate relative to the resist (UV1610, manufactured by Dow Chemical Company) was determined. The results are shown in Table 2.

The coatings formed from the present compositions showed a suitable etching rate of 1.0 or less.

TABLE 2

| | Etching rate |
| --- | --- |
| Composition 1 | 0.8 |
| Composition 2 | 0.8 |
| Composition 3 | 0.7 |
| Composition 4 | 0.7 |
| Comparative Composition 1 | 1.0 |
| Comparative Composition 2 | 2.0 |
| Comparative Composition 3 | 0.9 |
| Composition 5 | 0.7 |
| Composition 6 | 1.0 |
| Composition 7 | 0.7 |
| Composition 8 | 0.7 |

Evaluation of Optical Constant

The compositions and comparative compositions shown in Table 3 were applied onto a silicon wafer and baked for 60 seconds at 215° C. to form a coating. When reflected light was measured with Ellipsometer M2000-D (J. A. Woollam) at a wavelength of 248 nm for measuring optical constants, the (n) value and the (k) value were as shown in Table 3.

TABLE 3

| | (n) value | (k) value |
| --- | --- | --- |
| Composition 1 | 1.77 | 0.10 |
| Composition 2 | 1.86 | 0.01 |
| Composition 3 | 1.87 | 0.06 |
| Composition 4 | 1.87 | 0.29 |
| Comparative Composition 1 | 1.76 | 0.10 |
| Comparative Composition 2 | 1.68 | 0.00 |
| Comparative Composition 3 | 1.77 | 0.10 |
| Composition 5 | 1.87 | 0.06 |
| Composition 6 | 1.77 | 0.10 |

Evaluation of Coating Uniformity

The compositions and comparative compositions shown in Table 4 were applied onto a silicon wafer by spin coating to evaluate the uniformity of coatings. The evaluation was performed based on the following criteria. The evaluation results are shown in Table 4.

Good: Uniform coating was visually confirmed.

Poor: The presence of speckles was visually confirmed.

Evaluation of Gap Filling Property

The compositions and comparative compositions shown in Table 4 were applied onto a stepped silicon substrate (line space ratio: 1:2, pitch width: 48 nm (L16 nm/S32 nm)) by spin coating, and a cut piece of the substrate was observed with SEM to evaluate the gap filling property. The evaluation was performed based on the following criteria. The evaluation results are shown in Table 4.

Good: In a SEM photograph, no void was present in the steps where a composition was filled.

Poor: In a SEM photograph, a void was present in the steps where a composition was filled.

The coatings formed from the present compositions had good gap filling property, while comparative compositions in which polymer A of the present compositions was not used had poor gap filling property.

Confirmation of Standing Wave

The compositions and comparative compositions shown in Table 4 were applied onto a bare silicon wafer by spin coating and baked for 60 seconds at 215° C. to form a coating having a thickness of 120 nm. A photoresist (DX6270P, Merck Performance Materials Manufacturing G.K.) was formed on the coating by spin coating and baked for 90 seconds at 120° C. to form a photoresist coating having a thickness of 340 nm.

The wafer was imagewise exposed using a 248 nm exposure tool (mask size=200 nm, line:space=1:1). The exposed wafer was baked for 90 seconds at 130° C. and developed for 60 seconds using a 2.38 wt % aqueous solution of tetramethylammonium hydroxide. The developed wafer was rinsed with water and spin-dried. The line and space pattern of the dried wafer was observed with a scanning electron microscope. The evaluation was performed based on the following criteria. The evaluation results are shown in Table 4.

Good: Reduction of standing waves was observed, and the resist wall surface was hardly wavy.

Fair: Reduction of standing waves was observed, but the resist wall surface was slightly wavy.

Poor: Reduction of standing waves was not shown.

Reduction of standing waves in the coatings of the present compositions was verified, and it was verified that the coatings have good antireflection effect. It was verified that, as compared with the composition which does not comprise polymer B, the compositions comprising polymer B had a stronger antireflection effect and were able to further suppress the waviness of the resist wall surface.

TABLE 4

|  | Coating uniformity | Gap filling property | Standing wave |
|---|---|---|---|
| Composition 1 | Good | Good | Good |
| Composition 2 | Good | Good | Fair |
| Composition 3 | Good | Good | Good |
| Composition 4 | Good | Good | Good |
| Comparative Composition 1 | Good | Poor | Good |
| Comparative Composition 2 | Good | Poor | Good |

Verification of Crosslinking Properties

The compositions and comparative compositions shown in Table 5 were applied onto a bare silicon wafer by spin coating and baked for 60 seconds at 185° C. for crosslinking to form a coating having a thickness of 120 nm. The initial thickness of the coating was measured using Lambda Ace (VM-1210, Dainippon Screen Mfg. Co., Ltd.). The wafer was immersed in a PGMEA/PGME solution (AZ EBR7030, Merck Performance Materials Manufacturing G.K.) for 60 seconds and then spin-dried, and the coating thickness was measured again. When the coating thickness decreased by 2 nm or more as compared with the initial thickness, the crosslinking was evaluated to be insufficient. When the crosslinking was insufficient, the temperature for crosslinking was successively increased to 205 degrees, 225 degrees, and 245 degrees, and the same experiment and evaluation were performed.

It was verified that, when a coating was formed from the present composition, the coating was able to be sufficiently crosslinked even at a low temperature as compared with comparative composition containing a high-molecular crosslinking agent.

TABLE 5

|  | Temperature |
|---|---|
| Composition 1 | 185 degrees |
| Composition 3 | 185 degrees |
| Comparative Composition 3 | 245 degrees |

The invention claimed is:
1. A bottom antireflective coating forming composition, comprising:
a polymer A consisting of a repeating unit represented by formula (I) and a repeating unit represented by formula (II):

[Formula 1]

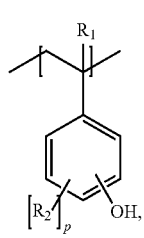
(I)

[Formula 2]

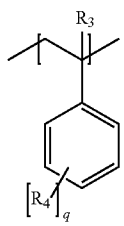
(II)

wherein $R_1$ is hydrogen, $C_{1-6}$ alkyl, halogen, or cyano, $R_2$ is $C_{1-6}$ alkyl, hydroxy, halogen, or cyano, p is 0, 1, 2, 3, or 4, $R_3$ is hydrogen, $C_{1-6}$ alkyl, halogen, or cyano, $R_4$ is $C_{1-6}$ alkyl, halogen, or cyano, and q is 0, 1, 2, 3, 4, or 5;

a polymer B comprising a repeating unit comprising an aromatic hydrocarbon ring in the main chain or the side chain, wherein the repeating unit of the polymer B is represented by formula (III), formula (IV), or formula (V):

formula (III)

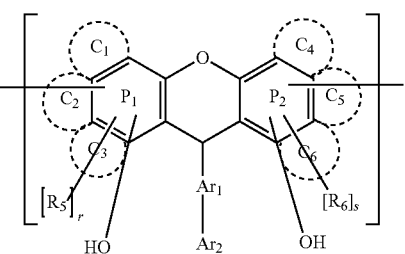
(III)

wherein $Ar_1$ is a direct bond, $C_{1-6}$ alkyl, or $C_{6-12}$ aryl, $Ar_2$ is $C_{6-12}$ aryl, $R_5$ and $R_6$ are each independently $C_{1-6}$ alkyl, hydroxy, halogen, or cyano, r and s are each independently 0, 1, 2, 3, 4, or 5, at least one of the $C_1$, $C_2$, and $C_3$ rings each surrounded by the broken line is an aromatic hydrocarbon ring fused with the adjacent aromatic hydrocarbon ring $P_1$, otherwise the $C_1$, $C_2$, and $C_3$ ring(s) is not present and at least one of the $C_4$, $C_5$, and $C_6$ rings each surrounded by the broken line is an aromatic hydrocarbon ring fused with the adjacent aromatic hydrocarbon ring $P_2$, otherwise the $C_4$ $C_5$ or $C_6$ ring(s) is not present:

formula (IV)

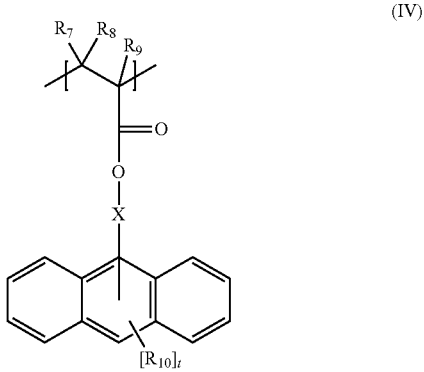

wherein
X is a direct bond or $C_{1-6}$ alkyl,
$R_7$, $R_8$, and $R_9$ are each independently hydrogen, $C_{1-6}$ alkyl, halogen, or cyano,
$R_{10}$ is $C_{1-6}$ alkyl, hydroxy, halogen, or cyano, and
t is 0, 1, 2, 3, 4 or 5;

formula (V)

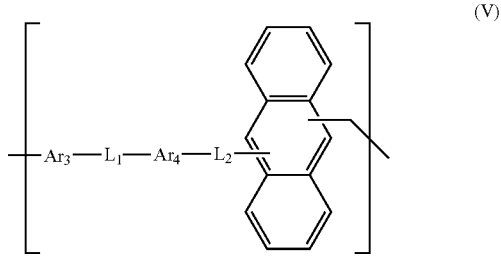

wherein
$Ar_3$ is unsubstituted or substituted $C_{6-14}$ aryl, the substituent being $C_{1-6}$ alkyl, hydroxyl, or carboxyl,
$Ar_4$ is unsubstituted or substituted $C_{6-14}$ aryl, the substituent being $C_{1-6}$ alkyl, hydroxyl, or carboxyl,
$L_1$ and $L_2$ are each independently a direct bond or $C_{1-6}$ alkyl;
a low molecular crosslinking agent having a molecular weight of 100 to 3,000; and
a solvent
provided that the content of polymer B in the composition is 1 to 175% by mass relative to the mass of polymer A.

2. The bottom antireflective coating forming composition according to claim 1, wherein $R_1$ is hydrogen, $R_2$ is methyl or hydroxy, p is 0 or 1, $R_3$ is hydrogen, $R_4$ is methyl, and q is 0 or 1.

3. The bottom antireflective coating forming composition according to claim 2, wherein in all the repeating units in the polymer A, the ratio of the repeating unit represented by formula (I) is 70 to 95 mol %, and the ratio of the repeating unit represented by formula (II) is 5 to 30 mol %.

4. The bottom antireflective coating forming composition according to claim 3, wherein the molecular weight of the low molecular crosslinking agent is 300 to 1,000.

5. The bottom antireflective coating forming composition according to claim 4, wherein the solvent comprises ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methylpyrrolidone, or a mixture thereof.

6. The bottom antireflective coating forming composition according to claim 5, wherein the composition further comprises a surfactant.

7. The bottom antireflective coating forming composition according to claim 1, wherein in all the repeating units in the polymer A, the ratio of the repeating unit represented by formula (I) is 70 to 95 mol %, and the ratio of the repeating unit represented by formula (II) is 5 to 30 mol %.

8. The bottom antireflective coating forming composition according to claim 1, wherein the molecular weight of the low molecular crosslinking agent is 300 to 1,000.

9. The bottom antireflective coating forming composition according to claim 1, wherein the solvent comprises ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, N,N-dimethylformamide, N,N-dimethylacetamide, N-methylpyrrolidone, or a mixture thereof.

10. The bottom antireflective coating forming composition according to claim 1, wherein the composition further comprises a surfactant.

11. A resist pattern manufacturing method, comprising:
forming, on a substrate, a bottom antireflective coating from a bottom antireflective coating forming composition according to claim 1;
forming a photoresist coating on the bottom antireflective coating; and
exposing and developing the photoresist coating to form a resist pattern.

12. A semiconductor device manufacturing method, comprising:
forming, on a substrate, a bottom antireflective coating from a bottom antireflective coating forming composition according to claim 1;
forming a photoresist coating on the bottom antireflective coating;
exposing and developing the photoresist coating to form a resist pattern; and
forming a gap in the substrate or a layer on the substrate using the resist pattern as a mask.

13. The semiconductor device manufacturing method according to claim 12, wherein after forming the gap, the method further comprises contacting the resist pattern with water, a liquid mixture of a water-soluble organic solvent and water, or an alkali aqueous solution to thereby remove the resist pattern.

14. The semiconductor device manufacturing method according to claim 12, wherein the method further comprises forming wiring in the gap.

15. The bottom antireflective coating forming composition according to 15, wherein the low molecular crosslinking agent is represented by formula (VI);

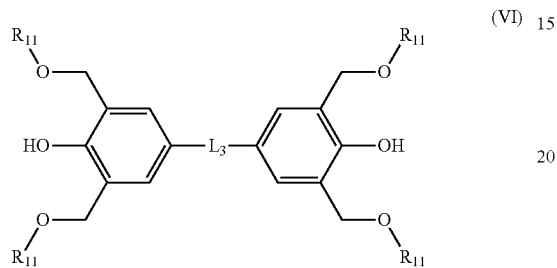

$L_3$ is a direct bond or substituted or unsubstituted $C_{1-3}$ alkyl;

the substituent is hydrogen, methyl, $C_{6-10}$ aryl, formula (VII), or formula (VIII),

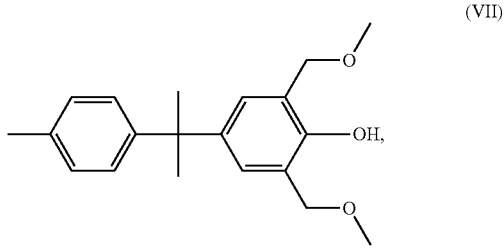

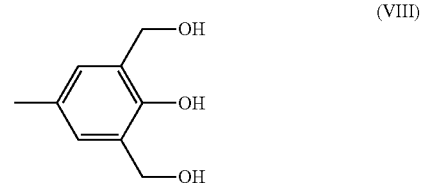

$R_{11}$ is hydrogen or methyl.

16. The bottom antireflective coating forming composition according to claim 15, wherein the weight average molecular weight (Mw) of the polymer A is 2,000 to 5,000, and the weight average molecular weight (Mw) of the polymer B is 800 to 12,000.

17. The bottom antireflective coating forming composition according to claim 15, wherein the content of the polymer B is 10 to 150% by mass relative to the mass of the polymer A in the composition and the content of the low molecular crosslinking agent is 5 to 50% by mass, relative to the mass of the polymer A in the composition.

* * * * *